United States Patent
Li et al.

(10) Patent No.: US 7,538,482 B2
(45) Date of Patent: May 26, 2009

(54) FLAT DISPLAY PANEL AND BLACK MATRIX THEREOF

(75) Inventors: Shi-Hao Li, Taipei County (TW); Ming-Chang Shih, Chang-Hua Hsien (TW)

(73) Assignee: AU Optronics Corp., Hsin-Chu (TW)

( * ) Notice: Subject to any disclaimer, the term of this patent is extended or adjusted under 35 U.S.C. 154(b) by 547 days.

(21) Appl. No.: 11/307,443

(22) Filed: Feb. 8, 2006

(65) Prior Publication Data
US 2007/0090754 A1 Apr. 26, 2007

(30) Foreign Application Priority Data
Oct. 25, 2005 (TW) .............................. 94137307 A

(51) Int. Cl.
*H05B 33/00* (2006.01)
*H05B 33/22* (2006.01)
*H05B 33/24* (2006.01)

(52) U.S. Cl. .................... 313/501; 313/110; 313/112; 313/117; 313/506; 349/104; 349/110

(58) Field of Classification Search ......... 313/110–112, 313/116, 117, 501, 506; 349/104, 110
See application file for complete search history.

(56) References Cited

U.S. PATENT DOCUMENTS

| 5,589,732 | A | 12/1996 | Okibayashi et al. |
| 6,902,943 | B2 * | 6/2005 | Koo et al. ............ 257/E27.099 |
| 2003/0117059 | A1 | 6/2003 | Koo et al. |
| 2003/0193284 | A1 | 10/2003 | Park et al. |
| 2004/0149989 | A1 * | 8/2004 | Matsunaga et al. ............ 257/59 |

FOREIGN PATENT DOCUMENTS

| JP | 05173172 A | * | 7/1993 |
| JP | 05218483 A | * | 8/1993 |
| JP | 6-324326 | | 11/1994 |
| JP | 08338991 A | * | 12/1996 |
| JP | 10177185 A | * | 6/1998 |
| JP | 11174210 A | * | 7/1999 |
| JP | 2000028821 A | * | 1/2000 |

* cited by examiner

*Primary Examiner*—Mariceli Santiago
(74) *Attorney, Agent, or Firm*—Winston Hsu

(57) ABSTRACT

A BM (black matrix) structure has a semiconductor layer and a light-shielding layer. The semiconductor layer has a first surface and a second surface. The light-shielding layer is disposed on the first surface of the semiconductor layer, and the second surface is an incident plane of environmental light.

21 Claims, 7 Drawing Sheets

FLAT DISPLAY PANEL AND BLACK MATRIX THEREOF

BACKGROUND OF THE INVENTION

1. Field of the Invention

The present invention relates to a flat display panel and black matrix thereof, and more particularly, to an organic light emitting diode display panel having a black matrix structure with a light-shielding layer and a semiconductor layer.

2. Description of the Prior Art

Organic light emitting diode displays (OLEDs) are one type of electroluminescene (EL) display and have the advantages of high brightness, rapid response speed, light weight, low power consumption, and wide viewing angle. Therefore, OLEDs expected to replace the liquid crystal display (LCD) and the plasma display and become the mainstream.

Generally, a conducting wire pattern or electrodes made of metal in the OLED display reflect light from the environment and cause the problem of poor contrast. Therefore, a black matrix structure or a polarizing film is often installed in the OLED display to improve the poor contrast.

Please refer to FIG. 1. FIG. 1 is a schematic diagram of a conventional black matrix structure of an OLED display. As illustrated in FIG. 1, the conventional black matrix structure 10 is formed on a substrate 20 of an OLED display. The black matrix structure 10 comprises a chromium oxide layer 12 disposed on the surface of the substrate 20, a chromium nitride layer 14 disposed on the surface of the chromium oxide layer 12, and a chromium layer 16 disposed on the chromium nitride layer 14. Another surface of the substrate 20 is the display plane of the OLED display. When the environmental light enters the substrate 20 (as the solid arrows show in FIG. 1), the black matrix structure 10 will absorb part of the environmental light to reduce the reflection (as the dashed arrows show in FIG. 1) and improve the contrast of the OLED.

However, the conventional black matrix structure includes chromium, chromium oxide, and chromium nitride, and these materials produce poisonous substances such as $Cr^{6+}$ after etching processes, which may cause environment pollution. Therefore many developed countries have decided to limit the application range of the abovementioned materials. In addition, the resistance to electrostatic discharge of the conventional black matrix structure is typically insufficient, and therefore, the OLED display is easily affected and damaged by electrostatic discharge. Furthermore, although the reflection of environmental light can be effectively reduced by disposing a polarizing film on the surface of the substrate, the emitted light from the OLED itself has a transmittance of only about 43%, resulting in a reduction of brightness and an increase of power consumption. Meanwhile, the practice of the polarizing film also increases the thickness of the panel and adds a consideration for a yield rate of a coating process.

SUMMARY OF THE INVENTION

It is therefore an objective of the claimed invention to provide a flat display panel and black matrix structure thereof.

The claimed invention provides a black matrix structure which comprises a semiconductor layer including a first surface and a second surface, and a light-shielding layer positioned on the first surface of the semiconductor layer. The second surface of the semiconductor layer is an incident plane of environmental light.

The claimed invention further provides a flat display panel comprising a substrate on which a plurality of pixel areas is defined, and a black matrix structure. The black matrix structure has a semiconductor layer, and a light-shielding layer overlaps the semiconductor layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
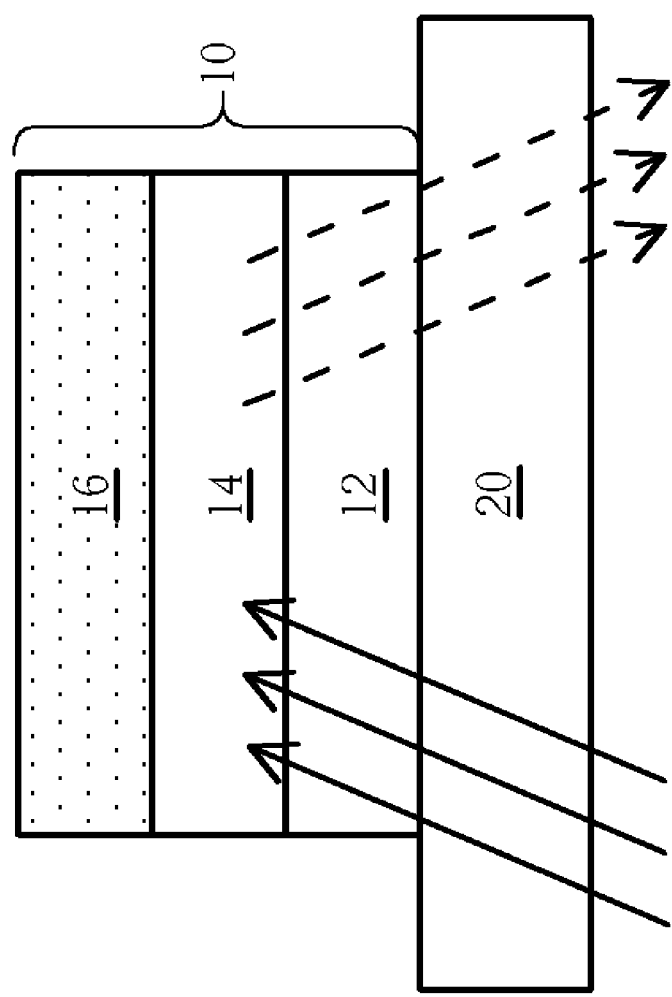
FIG. 1 is a schematic diagram of a conventional black matrix structure formed on an OLED display.
Figure 2:
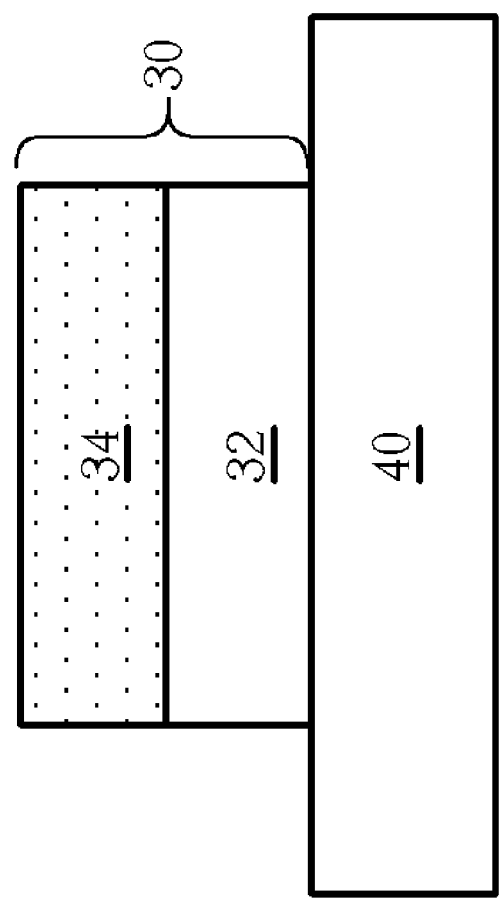
FIG. 2 is a schematic diagram of a black matrix structure of one preferred embodiment of the present invention.

Please refer to FIG. 2. FIG. 2 is a schematic diagram of a black matrix structure of one preferred embodiment of the present invention. As shown in FIG. 2, a black matrix structure 30 is formed on a substrate 40 of an OLED display, and the black matrix structure 30 comprises a semiconductor layer 32 and a light-shielding layer 34. The second surface (lower surface) of the semiconductor layer 32 is an incident plane of environmental light and in contact with the surface of the substrate 40. The light-shielding layer 34 is disposed on the first surface (upper surface) of the semiconductor layer 32. In this embodiment, the thickness of the semiconductor layer 32 is between 100 angstroms and 300 angstroms, but this range is not limiting. The material of the semiconductor layer 32 includes silicon or germanium, while the lattice arrangement of silicon or germanium can be single crystal, amorphous, or polycrystalline. In addition, the material of the light-shielding layer 34 includes titanium, nickel, indium, copper, silver, aluminum, molybdenum, an alloy of the aforementioned metals, or a stacked combination of oxides of the aforementioned alloys. The light-shielding layer 34 can include semiconductor dopant. Due to the light-shielding characteristic of the semiconductor layer 32 cooperating with the light-shielding layer 34, the black matrix structure 30 of the present invention has a good anti-reflective effect.

Figure 3:
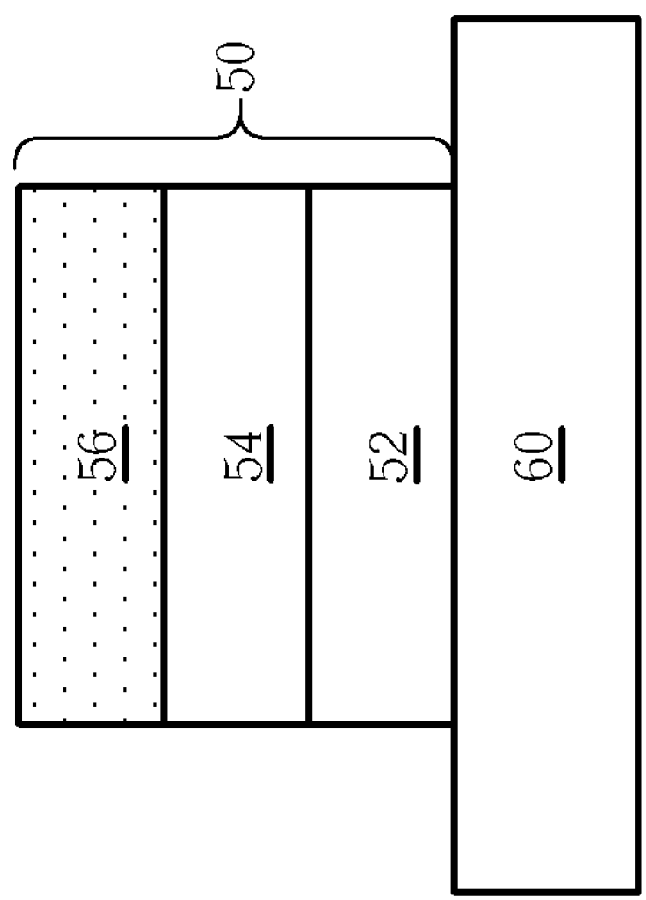
FIG. 3 is a schematic diagram of a black matrix structure of another preferred embodiment of the present invention.

Please refer to FIG. 3. FIG. 3 is a schematic diagram of a black matrix structure of another preferred embodiment of the present invention. As shown in FIG. 3, a black matrix structure 50 is formed on a substrate 60 of an OLED display. The black matrix structure 50 comprises a transparent layer 52 disposed on the surface of the substrate 60, a semiconductor layer 54 disposed on the surface of the transparent layer 52, and a light-shielding layer 56 disposed on the surface of the semiconductor layer 54. In this preferred embodiment, the refractive index of the transparent layer 52 is larger than that of the substrate 60. The thickness of the transparent layer 52 is between 400 angstroms and 700 angstroms, but this range is not limiting. The material of the transparent layer 52 can be titanium, nickel, tantalum, indium, copper, silver, aluminum, molybdenum, tin, tungsten, semiconductor material, titanium alloy, nickel alloy, tantalum alloy, indium alloy, copper alloy, silver alloy, aluminum alloy, molybdenum alloy, tin alloy, tungsten alloy, or oxide, nitride, or oxynitride of the aforementioned alloys. In addition, the thickness of the semiconductor layer 54 is between 100 angstroms and 300 angstroms, and the material of the semiconductor layer 54, as in the aforementioned preferred embodiment, includes silicon or germanium. In addition, the lattice arrangement of silicon or germanium can be single crystal, amorphous, or polycrystalline. Furthermore, the material of the light-shielding layer 56, as in the aforementioned preferred embodiment, includes titanium, nickel, indium, copper, silver, aluminum, molybdenum, a alloy of the aforementioned metals, or a stacked combination of oxides of the aforementioned alloys. The light-shielding layer 34 can include semiconductor dopant. In this embodiment, in addition to the good anti-reflective characteristic provided by the semiconductor layer 54 cooperating with the light-shielding layer 56, the electrostatic charge protection property of the black matrix 50 is improved and damage from electrostatic charge on the OLED display panel is prevented by choosing conductive material for the transparent layer 52.

Figure 4:
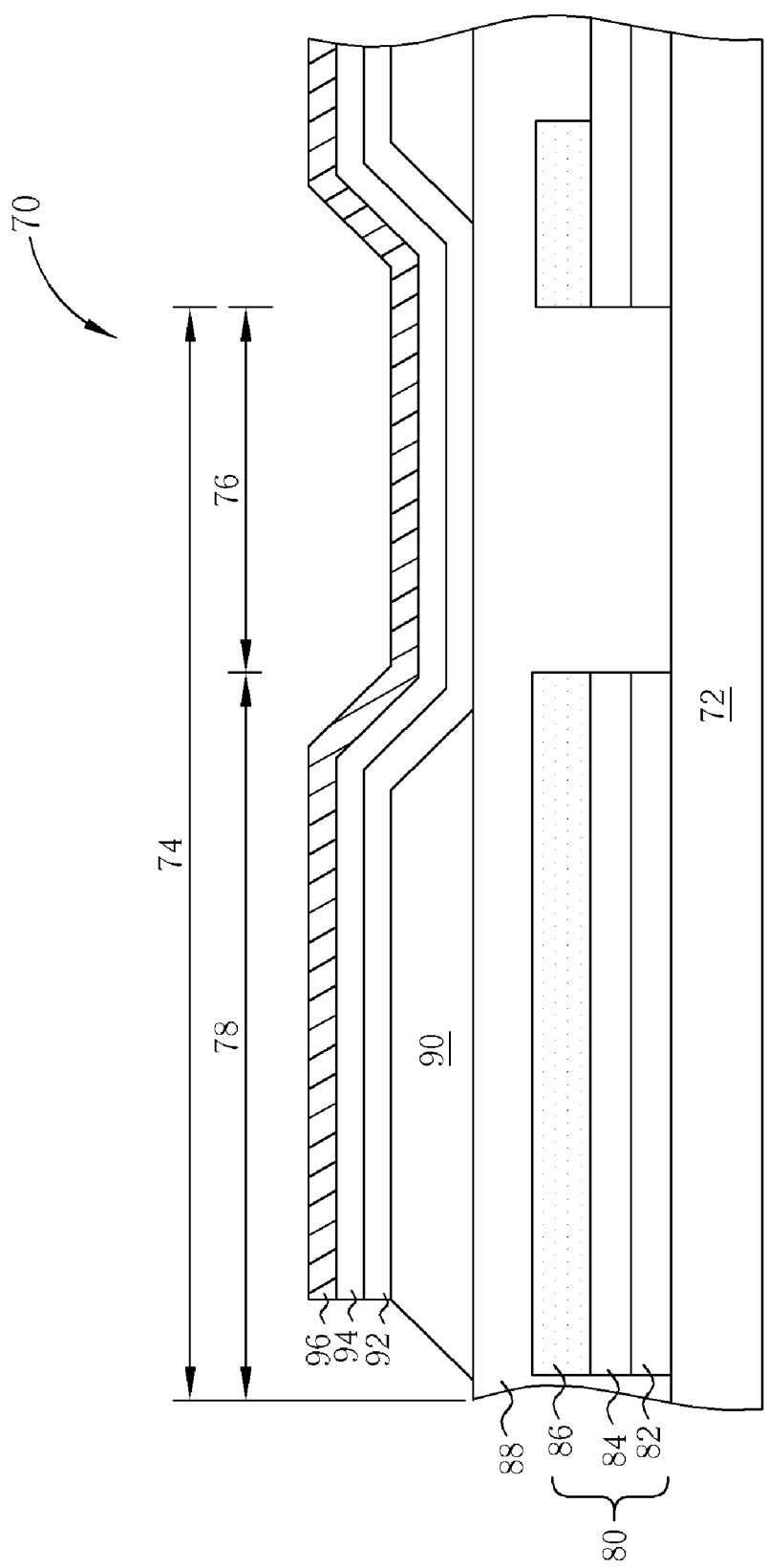
FIG. 4 is a schematic diagram of an OLED display panel of one preferred embodiment of the present invention.

Please refer to FIG. 4. FIG. 4 is a schematic diagram of an OLED display panel of one preferred embodiment of the present invention. To clearly show the features of the present invention, only one substrate and one pixel area are shown in FIG. 4. As illustrated in FIG. 4, an OLED display panel 70 comprises a substrate (lower substrate) 72 made of transparent material such as glass, plastic, or quartz, for example. A plurality of pixel areas 74 are defined on the substrate 72 and the pixel areas 74 are divided into a display region 76 and a switch device region 78. In addition, a black matrix structure 80 is formed on the surface of the substrate 72. The black matrix 80 comprises a transparent layer 82 disposed on the surface of the substrate 70, a semiconductor layer 84 disposed on the surface of the transparent layer 82, and a light-shielding layer 86 disposed on the surface of the semiconductor layer 84. In this embodiment, the material and the thickness of the transparent layer 82, the semiconductor layer 84, and the light-shielding layer 86 are the same as those described above and further description is omitted. It is noteworthy that because the light-shielding layer 86 is opaque, it has to be formed in the switch device region 78 and beyond the display region 76, while the positions of the semiconductor layer 84 and the transparent layer 82 are not limited. In this preferred embodiment, the semiconductor layer 84 and the transparent layer 82 are formed in the switch device region 78 only. Furthermore, an inter-layer dielectric 88 used as a planarization layer is formed on the substrate 72 within the display region 76 and on the light-shielding layer 86 within the switch device region 78, and a switch device 90 (such as a thin film transistor device) is sequentially stacked in the switch device region 78. In addition, the inter-layer dielectric 88 and the switch device 90 sequentially comprise a pixel electrode 92 electrically connected to the switch device 90, an organic light emitting layer 94, and a cathode 96 thereon.

Figure 5:
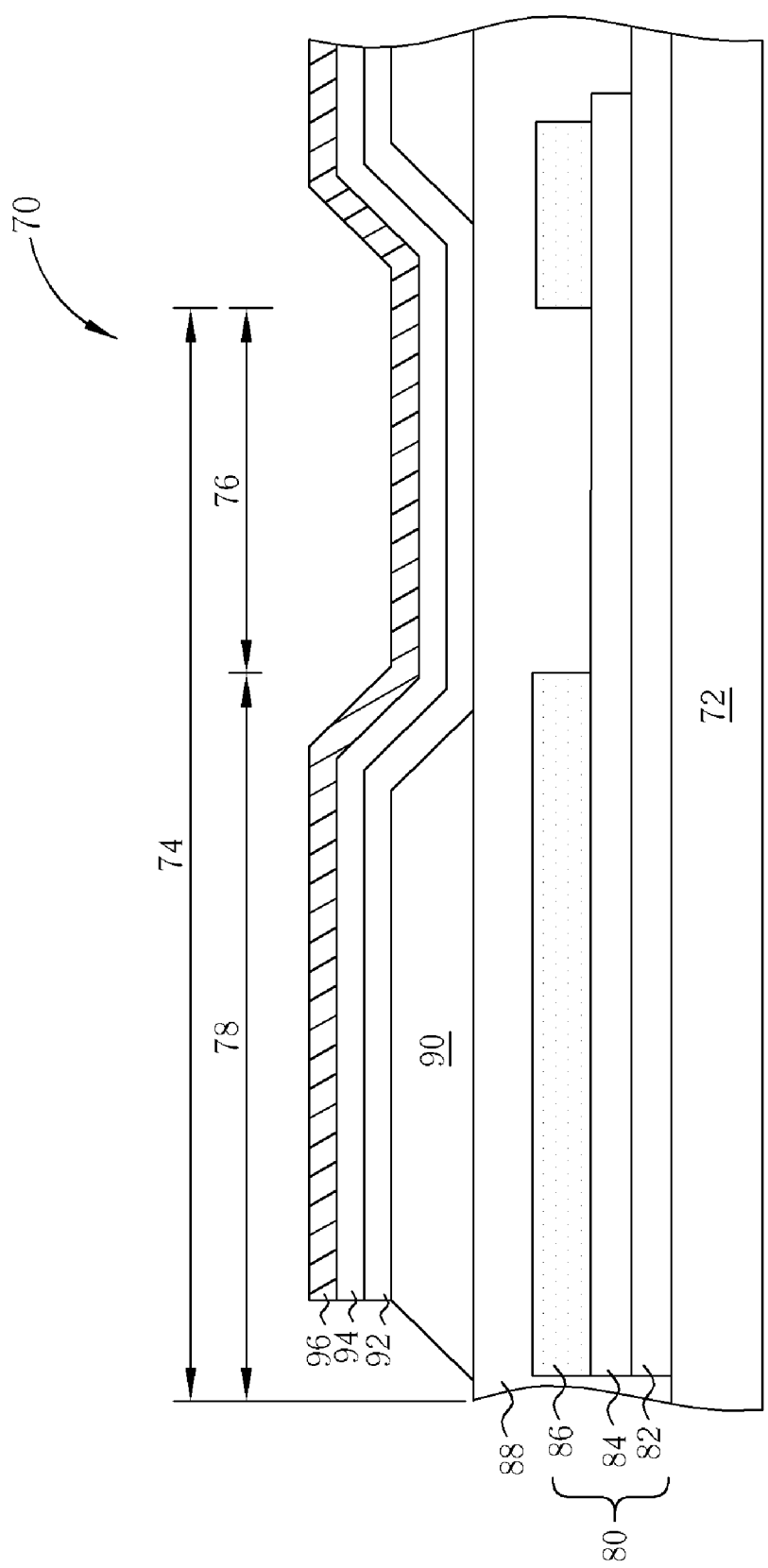
FIG. 5 is a schematic diagram of an OLED display panel of another preferred embodiment of the present invention.

Please refer to FIG. 5. FIG. 5 is a schematic diagram of an OLED display panel of another preferred embodiment of the present invention. For detailing the difference between this embodiment and the aforementioned embodiment, the same elements in FIGS. 4 and 5 are shown with the same numerals. As shown in FIG. 5, an OLED display panel 70 comprises a substrate 72 on which a plurality of pixel areas 74 is defined. Each of the pixel areas 74 is divided into a display region 76 and a switch device region 78. In addition, a black matrix structure 80 is formed on the surface of the substrate 72. The black matrix 80 comprises a transparent layer 82 disposed on the surface of the substrate 70, a semiconductor layer 84 disposed on the transparent layer 82, and a light-shielding layer 86 disposed on the surface of the semiconductor layer 84. Because the light-shielding layer 86 is opaque, it has to be formed in the switch device region 78 and beyond the display region 76, while the semiconductor layer 84 and the transparent layer 82 are simultaneously formed within the switch device region 78 and the display region 76 in order to simplify the fabricating processes. An inter-layer dielectric 88 used as a planarization layer is formed on the semiconductor layer 84 within the display region 76 and on the light-shielding layer 86 within the switch device region 78, and a switch device 90 (such as a thin film transistor device) is sequentially stacked in the switch device region 78. In addition, the inter-layer dielectric 88 and the switch device 90 sequentially comprise a pixel electrode 92 electrically connected to the switch device 90, an organic light emitting layer 94, and a cathode 96 thereon.

The difference between the abovementioned two embodiments is the positions where the transparent layer 82, the semiconductor layer 84, and the light-shielding layer 86 are formed. One of the embodiments has its transparent layer 82, semiconductor layer 84, and light-shielding layer 86 all formed within the switch device region 78 of the OLED display panel 70. The other embodiment has its light-shielding layer 86 formed within the switch device region 76, while its transparent layer 82 and semiconductor layer 84 are formed simultaneously within the display region 76 and the switch device region 78. It should be noted that because the main feature of the present invention is the construction and the position of the black matrix structure 80, another substrate of the OLED display panel is omitted in the drawings. In addition, other elements of the OLED display panel 70, such as the construction of the electrode of the light emitting diodes, can be implemented with well-known designs and are not limited to what is described in the abovementioned embodiments.

Figure 6:
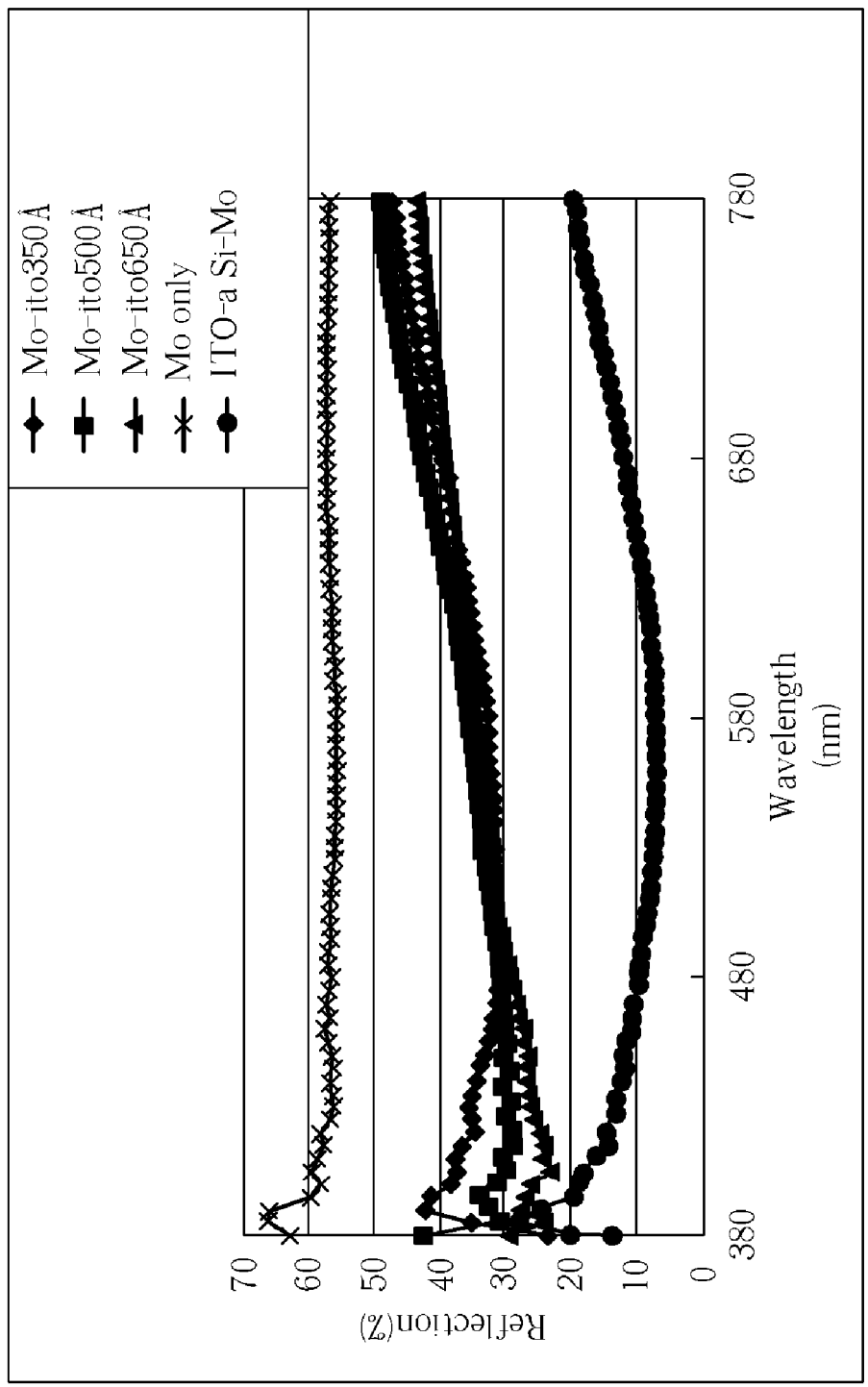
FIG. 6 is a schematic diagram of the comparison of the anti-reflective properties of the black matrix structure of the present invention.

Please refer to FIG. 6. FIG. 6 is a schematic diagram of the comparison of the anti-reflective properties of the black matrix structure of the present invention. As shown in FIG. 6, curve #1 represents the black matrix only comprising the light-shielding layer made of molybdenum. In this condition, the reflection of the black matrix in the visible light range (380 nm to 780 nm) is between 50% and 60%. It can be seen that the reflection of black matrix structure comprising only molybdenum is poor. Curve #2, curve #3, and curve #4 represent the black matrix structure comprising the light-shielding layer made of molybdenum and the transparent layer made of ITO, wherein the thickness of the ITO is 350 angstroms, 500 angstroms, and 650 angstroms respectively. In this condition, the reflection of the black matrix is substantially between 25% and 50%. Furthermore, curve #5 represents the black matrix structure further comprising the semiconductor layer. In this condition, the reflection of the black matrix structure drops off greatly resulting in an efficient enhancement of the anti-reflective property. As curve #5 shows, the reflection of the black matrix structure comprising molybdenum (light-shielding layer), amorphous silicon (semiconductor layer), and ITO (transparent layer) in the most visible light range is between 5% and 20%, which is a good anti-reflective capability. Thus, the black matrix structure comprising a semiconductor according to the present invention has good anti-reflective efficiency.

Figure 7:
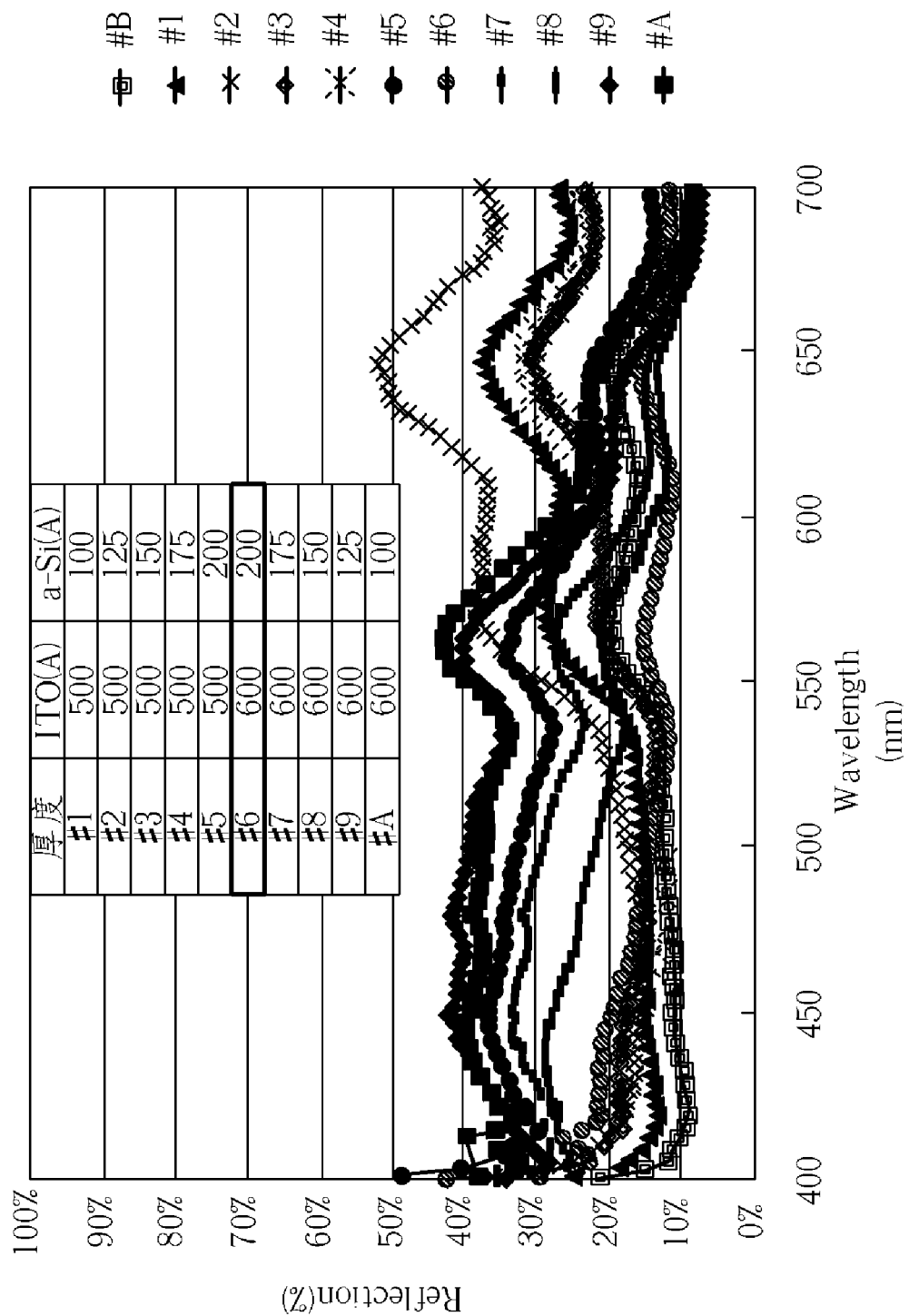
FIG. 7 is another schematic diagram of the comparison of the anti-reflective properties of the black matrix structure of the present invention.

Please refer FIG. 7. FIG. 7 is another schematic diagram of comparison of the anti-reflective capabilities of the black matrix structure of the present invention. As shown in FIG. 7, curve #1 to curve #9 and curve #A respectively represent the variation of the reflection of the black matrix structure in combination with the ITO (transparent layer) and the amorphous silicon layer (semiconductor layer) in different thicknesses in the most visible light range (400 nm to 700 nm). Curve #B represents reflection of a conventional black matrix structure made of chromium, chromium nitride, and chromium oxide. As illustrated in FIG. 7, when the thickness of the ITO is 600 angstroms and the thickness of the amorphous silicon is 200 angstroms, the black matrix structure of the present invention obtains a better anti-reflective capability. The reflection of the black matrix structure with this construction is similar to that of the conventional black matrix structure and even lower in some wavelength ranges, resulting better anti-reflective capability.

As mentioned above, the OLED display panel of the present invention uses a black matrix structure including a light-shielding layer, a semiconductor layer, and a transparent layer to solve the problems in the conventional black matrix structure, such as pollution, to prevent damage from electrostatic discharge, and to provide good anti-reflective capability. Although the abovementioned embodiments exemplify the present invention in a rear emission type OLED display panel, the flat display panel in the present invention is not limited to this kind of panel. The flat display panel can be a front emission type OLED display panel, a liquid crystal display panel, or another type of flat display panel. In addition, the switch device is not limited to being an active switch device, but can also be a passive switch device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A black matrix structure comprising:
a semiconductor layer possessing a light-shielding characteristic and having a first surface and a second surface; and
a light-shielding layer comprising semiconductor dopants positioned on the first surface of the semiconductor layer;
wherein the second surface of the semiconductor layer is an incident plane of environmental light.

2. The black matrix structure of claim 1, wherein a material of the light-shielding layer includes titanium, nickel, indium, copper, silver, aluminum, molybdenum, an alloy of the aforementioned metals, or a stacked combination of oxides of the aforementioned alloys.

3. The black matrix structure of claim 1, wherein a material of the semiconductor layer includes silicon or germanium.

4. The black matrix structure of claim 1, further comprising a transparent layer formed on the second surface of the semiconductor layer, a material of the transparent layer including titanium, nickel, tantalum, indium, copper, silver, aluminum, molybdenum, tin, tungsten, or semiconductor.

5. The black matrix structure of claim 1 further comprising a transparent layer formed on the second surface of the semiconductor layer, a material of the transparent layer including oxide or nitride of titanium, nickel, tantalum, copper, silver, aluminum, molybdenum, tungsten or semiconductor.

6. A flat display panel comprising:
a substrate; and
a black matrix structure positioned on the substrate, comprising:
a semiconductor layer possessing a light-shielding characteristic and having a first surface and a second surface; and
a light-shielding layer comprising a semiconductor dopant and overlapping on the first surface of the semiconductor layer;
wherein the second surface of the semiconductor layer is an incident plane of environmental lights.

7. The flat display panel of claim 6, wherein a material of the light-shielding layer includes titanium, nickel, indium, copper, silver, aluminum, molybdenum, an alloy of the aforementioned metals, or a stacked combination of oxides of the aforementioned alloys.

8. The flat display panel of claim 6, wherein a material of the semiconductor layer includes silicon or germanium.

9. The flat display panel of claim 6, further comprising a plurality of pixel areas defined on the substrate, wherein each of the pixel areas is divided into a display region and a switch device region.

10. The flat display panel of claim 9, wherein the semiconductor layer is only formed within each of the switch device regions.

11. The flat display panel of claim 9, wherein the semiconductor layer is formed within each of the switch device regions and each of the display regions.

12. The flat display panel of claim 9, wherein the light-shielding layer is formed within each of the switch device regions and beyond each of the display regions.

13. The flat display panel of claim 6, further comprising a transparent layer disposed between the semiconductor layer and the substrate.

14. The flat display panel of claim 13, wherein a material of the transparent layer includes titanium, nickel, tantalum, indium, copper, silver, aluminum, molybdenum, tin, tungsten, or semiconductor.

15. The flat display panel of claim 13, wherein the transparent layer has a refractive index greater than that of the substrate.

16. The flat display panel of claim 6, wherein the material of the substrate includes glass, plastic, or quartz.

17. The flat display panel of claim 13, wherein a material of the transparent layer includes oxide or nitride of titanium, nickel, tantalum, copper, silver, aluminum, molybdenum, tungsten or semiconductor.

18. A black matrix structure comprising:
a semiconductor layer comprising germanium having a first surface and a second surface; and
a light-shielding layer comprising indium, molybdenum or copper positioned on the first surface of the semiconductor layer;
wherein the second surface of the semiconductor layer is an incident plane of environmental light and the light-shielding layer further comprises semiconductor dopants.

19. The black matrix structure of claim 18, further comprising a transparent layer formed on the second surface of the semiconductor layer, a material of the transparent layer including titanium, nickel, tantalum, copper, silver, aluminum, molybdenum, tungsten, semiconductor, or an oxide or nitride of the aforementioned materials.

20. A flat display panel comprising:
a substrate;
a black matrix structure positioned on the substrate, comprising:
a semiconductor layer possessing a light-shielding characteristic and having a first surface and a second surface; and a light-shielding layer overlapping on the first surface of the semiconductor layer;
  wherein the second surface of the semiconductor layer is an incident plane of environmental lights; and
a transparent layer disposed between the semiconductor layer and the substrate.

21. A black matrix structure comprising:

a semiconductor layer comprising germanium having a first surface and a second surface;

a transparent layer formed on the second surface of the semiconductor layer, a material of the transparent layer including titanium, nickel, tantalum, copper, silver, aluminum, molybdenum, tungsten, semiconductor, or an oxide or nitride of the aforementioned materials; and a light-shielding layer comprising indium, molybdenum or copper positioned on the first surface of the semiconductor layer;
  wherein the second surface of the semiconductor layer is an incident plane of environmental light.

* * * * *